United States Patent [19]

Wölber et al.

[11] Patent Number: 5,254,993
[45] Date of Patent: Oct. 19, 1993

[54] MULTIPLYING DIGITAL-TO-ANALOG CONVERTER

[75] Inventors: Jörg Wölber, Pinneberg; Klaus Kröner, Hamburg, both of Fed. Rep. of Germany

[73] Assignee: U.S. Philips Corporation, New York, N.Y.

[21] Appl. No.: 941,024

[22] Filed: Sep. 4, 1992

[30] Foreign Application Priority Data

Sep. 14, 1991 [DE] Fed. Rep. of Germany ........ 4130675

[51] Int. Cl.$^5$ ............................................. H03M 1/78
[52] U.S. Cl. ....................................... 341/135; 341/154
[58] Field of Search .................................. 341/135, 154

[56] References Cited

U.S. PATENT DOCUMENTS

| | | | |
|---|---|---|---|
| 4,595,912 | 6/1986 | Hoehn | 341/135 |
| 4,982,192 | 1/1991 | Murooka | 341/127 |
| 5,119,094 | 6/1992 | Brokaw | 341/154 |
| 5,128,674 | 7/1992 | Kong et al. | 341/127 |

Primary Examiner—Marc S. Hoff
Attorney, Agent, or Firm—Bernard Franzblau

[57] ABSTRACT

A multiplying digital-to-analog converter which includes an R-2R chain network is characterized in that, for partial or complete potential equalization, the chain network for an n-bit-wide digital signal applied to the converter comprises (n+m) connection points, where n,m are natural integers greater than zero, the connection point (n+m) produces the output signal of the converter. A first current mirror is provided which produces a constant first current that can be switched to the individual connection points (1+m) to (n+m). The least significant bit of the digital signal is allocated to the connection point (1+m) and the most significant bit to the connection point (n+m) and the first current is switched only to those connection points whose allocated bit has a first state. A second current mirror is provided which produces a constant second current that is larger than that of the first current mirror and can be switched to the individual connection points 1 to n, while the least significant bit is allocated to the connection point 1 and the most significant bit to the connection point n, the second current is switched only to those connection points whose allocated bit has a second state.

18 Claims, 1 Drawing Sheet

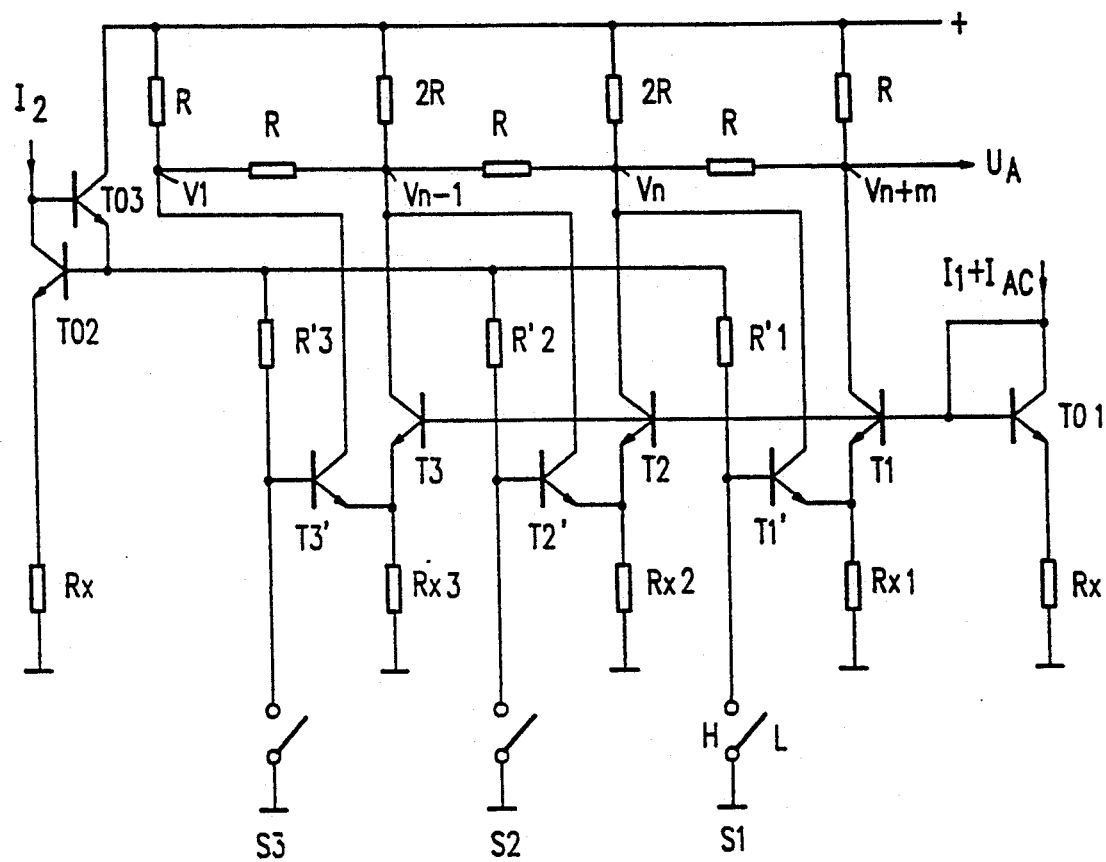

5,254,993

MULTIPLYING DIGITAL-TO-ANALOG CONVERTER

BACKGROUND OF THE INVENTION

This invention relates to a multiplying digital-to-analog converter for converting an n-bit-wide digital signal into an analog signal. The converter comprises a R-2R chain network, whose series resistors and whose shunt resistors positioned at either one of the two ends of the chain network each have a resistance R and whose remaining shunt resistors have a double resistance 2R, in which a supply voltage is impressed on the shunt resistor ends remote from the series resistors and the shunt resistor ends near to the series resistors form connection points, and which has an output presenting the output signal.

Such converters are designated multiplying digital-to-analog converters when the amplitude of the analog output signal depends on the magnitude of a current applied to the converter. In a converter comprising a R-2R chain network this current is switched to several connection points of the chain network, so that appropriate voltages and currents occur at the output in response to a digital signal applied to the converter and to be converted to the analog range. If the magnitude of this external current applied to the digital-to-analog converter is additionally varied, this also has an effect on the amplitude of the converter output signal.

Multiplying digital-to-analog converters of this type may thus be used for adjusting the amplitude of an AC signal which is superposed on the current applied to the converter. Depending on the digital word, the amplitude of this AC signal also is then changed in accordance with the states of the bits of the digital word. In addition, also the current, however, which is superposed by the AC current, is changed in accordance with the states of the bits. Thus, at the output of the converter appears not only the AC current whose amplitude is changed, but also a voltage or current value which corresponds to the conversion of the constant current in accordance with the states of the bits of the digital word to the analog range. As it were, a kind of DC current or DC voltage is thus superposed on the AC current or AC voltage signal respectively. This signal will be denoted offset signal hereinafter.

In many applications the time-dependent changes of such offset signals are undesired, because, for example, for adjusting a volume signal by means of such a multiplying digital-to-analog converter, such voltage or current jumps are undesired because they become audible.

SUMMARY OF THE INVENTION

It is an object of the invention to further develop the multiplying digital-to-analog converter mentioned in the opening paragraph to the effect that it is possible to adjust an AC signal or AC voltage signal respectively, while a complete or partial potential equalization, as appropriate, is effected.

According to the invention this object is achieved, in that;
the chain network for the n-bit-wide digital signal comprises (n+m) connection points, where n,m are natural integers greater than zero,
the connection point (n+m) produces the analog signal of the converter,
a first current mirror arrangement is provided which produces a constant first current that can be switched to the individual connection points (1+m) to (n+m), while the least significant bit of the digital signal is allocated to the connection point (1+m) and the most significant bit to the connection point (n+m) and while the first current is switched only to those connection points whose allocated bit has a first state, and
a second current mirror arrangement is provided which produces a constant second current that is larger than that of the first current mirror arrangement and can be switched to the individual connection points 1 to n, while the least significant bit is allocated to the connection point 1 and the most significant bit to the connection point n, and while the second current is switched only to those connection points whose allocated bit has a second state.

These measures permit adjusting, by way of the converter, the amplitude of an AC signal applied thereto as a function of the digital signal also applied to the converter. A complete potential equalization is then possible, i.e. the AC signal whose amplitude is adjusted appears at the output, without being superposed by DC components of variable magnitude.

If an n-bit-wide digital signal is applied to the converter as a function of which signal the amplitude of the AC signal is to be changed, (n+m) connection points are to be provided for the chain network, where (n+m) are natural integers greater than zero. The value of m may, in principle, be selected at random but is selected to be equal to 1 or 2 for reasons of obtaining the lowest possible cost of circuitry.

In this chain network comprising (n+m) connection points, the last connection point, the connection point (n+m) that is, supplies the converter output signal.

Two current mirror arrangements are provided each of which produce a constant current. The two currents each have a different magnitude and, depending on the significance of the bits, are not always switched to the same connection points.

If the chain network comprises (n+m) connection points, the first current mirror arrangement can be individually switched to the connection points (1+m) to (n+m). Then exactly 1 bit of the digital signal is allocated to each connection point, that is, in the manner in which the least significant bit is allocated to the connection point (1+m) and the most significant bit is allocated to the connection point (n+m). The first current produced by the first current mirror arrangement is now switched to the connection points the allocated bit of which has a first state, for example, the "high" state.

The second one of the two current mirror arrangements produces a constant second current which is larger than that of the first current mirror arrangement. This current can be individually switched to the connection points (1 to n). Here the least significant bit is allocated to the connection point (1) and the most significant bit to the connection point (n). This current too is then switched to the respectively allocated connection point as a function of the states of the allocated bits, when the allocated bit has a second state, for example, the "low" state.

As a result, the two currents produced by the current mirror arrangements are switched, shifted by (m) connection points, to the (n+m) connection points. With a corresponding choice of the magnitude of the first and second currents and with a suitable choice of the number (m) and with a constant first and a constant second current, it is possible that the same offset signal always appears at the output irrespective of the state of the bits of the digital word. For example, if (m=1) is chosen, and the second current is chosen to be twice as large as the first current, this condition is satisfied. This is due to the fact that, for example, when the most significant bit of the digital signal has a "high" value, the connection point Vm+1 is supplied with the first current. If, on the other hand, the most significant bit has the "low" value, the second current is applied to the connection point Vn. This current is exactly twice as large as the current $I_1$, but is halved by the chain network, so that at the output only half the value appears. Thus, irrespective of the state of the most significant bit, the same offset signal always will appear at the output. This analogously holds for the remaining bits of the digital signal.

For example, the magnitude of the current $I_1$ may now be changed, which results in its complete potential equalization no longer taking place, so that current values or values respectively, which can be changed as a function of the states of the bits of the digital word, appear at the output.

This digital-to-analog converter can thus be used as a multiplying converter while a partial or complete potential equalization is possible.

For practical applications the digital-to-analog converter will generally be arranged in such a way that the two DC currents produced by the current mirror arrangements have constant values. According to an embodiment of the invention the first current produced by the first current mirror arrangement is then superposed by an AC current which is contained in the output signal of the converter and has an amplitude that has changed as a function of the digital signal.

Should this adjustment of the amplitude of the AC signal be effected by means of a complete potential equalization, i.e. should the converter output signal whose amplitude is adjusted not be superposed by a signal which changes as a function of the states of the bit of the digital signal, according to a further embodiment, in order to provide a complete potential equalization of the output signal, the value of the second current of the second current mirror arrangement is (2 m) times the value of the first current of the first current mirror arrangement.

As a result the multiplying digital-to-analog converter makes it possible to adjust the amplitude of the AC signal without causing disturbing side effects. The structure of the whole circuit then remains very simple relative to other solutions and additionally has the advantage of being a relatively low-noise circuit.

Should the occasion arise, if only partial potential equalization is desired, it is possible to choose the value of the current $I_2$ of the second current mirror arrangement unequal to (2 m) times the value $I_1$ of the first current mirror arrangement.

For most applications it is sufficient, as is provided according to a further embodiment, to choose (m=1). In that case one connection point more is included in the chain network than the number of bits in the digital word. In this example, for a complete potential equalization the current $I_2$ is to be chosen twice as large as the current $I_1$. Both current mirror arrangements are to be structured such that they produce currents which are as constant as possible and contain a minimum degree of noise.

For this purpose it is provided that the first current mirror arrangement comprises a first transistor whose collector forms the input of the first current mirror arrangement, whose emitter is connected to a reference potential preferably through a resistor and whose collector and base are connected to each other, and includes n second transistors, each one of which is allocated to one of the connection points (1+m) to (n+m), the collectors of which are connected to the allocated connection points and the emitters of which to a reference potential preferably each through a resistor, the bases of which second transistors are connected to the base of the first transistor.

The current produced by the first current mirror arrangement, current $I_1$ that is, is applied to this arrangement from the exterior and is applied as a constant magnitude to the allocated connection points by the various current mirrors formed by the first transistor and the second transistors.

According to a further embodiment second current mirror arrangement comprises a first transistor, whose collector forms the input of the second current mirror arrangement, whose emitter is connected to a reference potential, preferably through a resistor, and includes a second transistor, whose base is supplied with the second current, whose collector is supplied with a supply voltage, whose emitter is connected to the base of the first transistor, and whose base is connected to the collector of the first transistor, and the second current mirror arrangement comprises n third transistors, each one of which is allocated to one of the connection point 1 to n, the collectors of which are connected to the allocated connection point, the emitters of which are connected to reference potential preferably each through a resistor and the bases of which third transistors are connected to the base of the first transistor each through a resistor.

The second current mirror arrangement has a similar structure to the first current mirror arrangement, but differs in that, additionally, a second transistor is provided which is connected on the side of the collector to a supply voltage. This achieves that with a relatively large current consumption of the circuit the magnitude of the currents switched to the connection points remains substantially constant.

For these two current mirror arrangements each comprising several current mirror circuits, according to a further embodiment, the bases of the third transistors of the second current mirror arrangement can be switched to a reference potential each via an allocated switch, which second arrangement is switched as a function of the state of each allocated bit of the digital signal The first and second currents, of the two current mirror arrangements are chosen so that when the switch is open, each allocated second transistor of the first current mirror arrangement is cut off and each allocated third transistor of the second current mirror arrangement is rendered conductive, and when the switch is closed, each allocated second transistor of the first current mirror arrangement is rendered conductive and the allocated third transistor of the second current mirror arrangement is cut off.

As a result of this connection of the two current mirror arrangements and the appropriate choice of the currents $I_1$ and $I_2$ respectively, of the two current mirror arrangements, a simple switch inserted between the bases of the third transistors of the second current mirror arrangement and reference potential is sufficient.

For each bit of the digital signal and for ecah third transistor of the second current mirror arrangement a switch is then provided which is changed over in accordance with the state of the allocated bit. As a result of the change over of this switch, which is normally arranged as an electronic switch, either the allocated second transistor of the first current mirror arrangement or the allocated third transistor of the second current mirror arrangement is then rendered conductive depending on the state of the allocated bit. However, it should be taken into consideration that the currents switched to the connection points by these two transistors may be switched to various connection points as has been explained hereinbefore. For example, the current of the first current mirror arrangement is switched to the connection point Vn+m as a function of the state of the most significant bit, whereas the current of the second current mirror arrangement is switched to the connection point Vn as a function of this bit.

A further embodiment of the invention provides for using the digital-to-analog converter for an audio and/or video playback device to influence the amplitude of an analog signal superposed on the first constant current, more specifically, of a volume signal, contrast signal or colour saturation signal of a colour television set. Since a complete or also partial potential equalization is possible for the AC current superposed on the first current, while the amplitude of the AC current is adjustable, a utilization of such a multiplying converter is possible for virtually all and/or video equipment. Especially in a television set the amplitudes of a great variety of analog adjusting values can be changed while, partially, a complete potential equalization is desired. This holds, for example, for volume or contrast adjusting values. For other values only a partial potential equalization is desired. The converter according to the invention is simply ideal for such purposes, having, on one hand, its multiplying feature and, on the other hand, possibly partial or complete potential equalization. In addition, its structure is relatively simple and the signal whose amplitude is to be adjusted is superposed with relatively little noise.

BRIEF DESCRIPTION OF THE DRAWING

An exemplary embodiment of the invention will be further explained with reference to the accompanying drawing.

DESCRIPTION OF THE PREFERRED EMBODIMENTS

The FIGURE shows a multiplying digital-to-analog converter arranged for a 3-bit-wide digital signal. This structure was chosen for brevity and to provide a very clear representation in the FIGURE, but obviously, the converter may also be arranged for six or ten bits or more of the digital signal.

The value of (m=1) was selected for the converter represented in the drawing FIGURE and, accordingly, a chain network provided in the represented converter comprises (n+m=3+1=4) connection points. These connection points are denoted Vl, Vn−1, Vn and Vn+m in the drawing FIGURE. The connection points are connected each by way of a series resistor R. As for the rest, shunt resistors 2R are provided which are connected to a supply voltage. The shunt resistors at either one of the two ends of the chain network have a resistance R. The connection point Vn+m forms the output of the converter.

As a result of the selection of the resistances of the resistors of the chain network, an equally large current supplied to the connection points generates for each connection point that is more remote from the connection point constituting the output of the circuit a signal at the output of the circuit, which signal is only half as large.

The converter further includes two current mirror arrangements whose currents are switched to the various connection points as a function of the states of a digital word.

A first current mirror arrangement is provided, which comprises a first transistor T01, to the collector side of which transistor a current $I_1$ is applied. This current $I_1$ is a constant DC current. An AC current $I_{AC}$ is superposed on this constant DC current.

The first transistor T01 of the first current mirror arrangement is connected with its emitter to a reference potential through a resistor Rx. The currents applied to the collector are also applied to the base of the transistor T01 which base, in addition, is connected to the bases of further transistors which represent the second transistors of the current mirror arrangement and are designated as T1, T2 and T3 in the drawing figure. The emitters of the transistors T1, T2 and T3 are connected to reference potential through emitter resistors Rx1, Rx2 and Rx3 respectively.

The collector of the transistor T1 is connected to the connection point Vn+m, the collector of the transistor T2 to the connection point Vn and the collector of the transistor T3 to the connection point Vn−1.

As will be further explained hereinafter, the most significant bit of the digital signal is allocated to the transistor T1 and the least significant bit of the digital signal to the transistor T3.

The second current mirror arrangement comprises a first transistor T02 and a second transistor T03. The arrangement is supplied from the exterior with a constant DC current $I_2$ which is fed to the collector of the first transistor T02 and the base of the second transistor T03. The emitter of the first transistor T02 is connected to the reference potential through a resistor Rx. The emitter of the second transistor T03 is connected to the base of the first transistor T02. The collector of the second transistor T03 is connected to a supply voltage.

Furthermore, the second current mirror arrangement comprises third transistors T1', T2' and T3' whose bases are connected to the base of the first transistor T02 each through a resistor R'1, R'2 and R'3 respectively. These transistors combined with the first transistor form current mirrors. The bases of the transistors T1', T2' and T3' can be switched to the reference potential each by way of a switch S1, S2 and S3 respectively. These switches are allocated to the bits of the digital signal and are opened in one state of the bit allocated thereto and closed in the other bit state.

The emitters of the transistors T1', T2' and T3' are connected to the emitters of each of the allocated transistors T1, T2 and T3 respectively.

The collector of the transistor T1' is connected to the connection point Vn, the collector of the transistor T2' to the connection point Vn−1 and the collector of the transistor T3' to the connection point V1.

The switch S1 is controlled as a function of the state of the most significant bit of a digital signal (not shown) and is allocated to the transistor T1 of the first current mirror arrangement and T1' of the second current mirror arrangement. The least significant bit but one controls the switch S2 to which the transistors T2 and T2' are allocated. The least significant bit of the digital signal determines the position of the switch S3 to which the transistors T3 and T3' are connected.

In the following it is assumed that the circuit is to provide a complete potential equalization. For this pupose, the current $I_2$ is to be selected twice as large as the current $I_1$ in the exemplary embodiment represented in the drawing figure in which the value of the number of connection of connection points was selected to be (m=1). If, for the moment, it is assumed that the AC current $I_{AC}$ is equal to zero, always the same output signal, i.e. an output signal having constant potential, will appear at the output of the converter formed by the connection point Vn+m, irrespective of the state of the bits of the digital signal.

This correlation may be explained with reference to, for example, the most significant bit.

If the most significant bit of the digital signal has, for example, the "high" state and if in this state the allocated switch S1 is closed, the transistor T1' of the second current mirror arrangement is cut off, i.e. it does not carry current on its collector. However, at the same time the transistor T1 of the first current mirror arrangement is rendered conductive, so that its collector carries the current $I_1$ which is supplied to the connection point Vn+m. A potential then appears at the output in accordance with this current. However, if the most significant bit has the "low" state, and thus the switch S1 is open, the transistor T1' of the second current mirror arrangement is rendered conductive and its collector carries the current $I_2$ which is supplied to the connection point Vn. The first transistor T1 is cut off in this case and does not supply any current to the connection point Vn+m. The current $I_2$ supplied to the connection point Vn by the transistor T1' of the second current mirror arrangement is twice as large as the current $I_1$, it is true, but is accordingly divided down by the chain network, so that at the output or at the connection point Vn+m the same output signal appears as in the previous case where the switch S1 was closed and the allocated bit had the "high" level. Thus, at the output of the converter the same potential always appears, which is independent of the state of the most significant bit. Accordingly, it holds in the same fashion for the rest of the circuit, i.e. for the remaining bits of the digital signal. Worded differently, the digital signal may adopt random values but at the output of the converter will always be at the same potential.

This property may now be used to modify the amplitude of an AC signal $I_{AC}$ applied to the converter from the exterior. This AC signal $I_{AC}$ is superposed on the first current $I_1$ and, by means of the transistors T1, T2 and T3, is thus switched or not to the individual connection points as a function of the states of the bits of the digital signal. As a function of the digital word and thus the transistors T1 to T3 which are rendered conductive or cut off, the AC signal is switched to various connection points of the chain network and thus divided down differently. In this manner the AC signal appears at the output of the converter with an amplitude changed as a function of the bit states of the digital signal.

This amplitude adjustment of the AC signal at the output of the converter is then made in an extremely low-noise manner and especially without disturbing side effects, i.e. without DC voltage jumps at the output of he circuit, which do occur in conventional multiplying digital-to-analog converters as a function of the states of the digital signal, because in these conventional converters the DC current $I_1$ is additionally converted by the converter and appears at the output almost as a kind of DC component.

Needless to observe that in the circuit according to the invention it is possible to perform a potential equalization that is not complete in that the current $I_2$ in the example shown in the drawing FIGURE is not selected to be twice as large as the current $I_1$. In that case a DC signal is additionally superposed on the AC signal whose amplitude has been adjusted at the output of the converter, which DC signal is changed as a function of the bit states.

It holds in general that the current $I_2$ is to exceed the current $I_1$ by so much that in dependence on the switches S1 to S3 a change-over can be effected between the allocated transistors. It then holds for the embodiment according to the drawing FIGURE that: $I_2 \times R_x > I_1 \times R_x + 100$ mV.

Once this condition has been satisfied, for example, the transistor T1' is certainly capable of switching through when switch S1 is open, the transistor T1 being cut off at the same time.

We claim:

1. A multiplying digital-to-analog converter for converting an n-bit-wide digital signal into an analog signal, which comprises: a R-2R chain network, whose series resistors and whose shunt resistors positioned at either of two ends of the chain network each have a resistance R and whose remaining shunt resistors have a double resistance 2R, a supply voltage being impressed on the shunt resistor ends remote from the series resistors and wherein the shunt resistor ends near to the series resistors form connection points, and which has an output presenting the output signal, characterized in that the chain network for the n-bit-wide digital signal comprises (n+m) connection points, where n,m are natural integers greater than zero, the connection point (n+m) produces the analog signal of the converter, A first current arrangement is provided which produces a constant first current that can be switched to the individual connection points (1+m) to (n+m), wherein the least significant bit of the digital signal is allocated to the connection point (1+m) and the most significant bit to the connection point (n+m) and the first current is switched only to those connection points whose allocated bit has a first state, and a second current mirror arrangement is provided which produces a constant second current that is larger than that of the first current mirror arrangement and can be switched to the individual connection points 1 to n, wherein the least significant bit is allocated to the connection point 1 and the most significant bit to the connection point n, and the second current is switched only to those connection points whose allocated bit has a second state.

2. A digital-to-analog converter as claimed in claim 1, wherein the first current produced by the first current mirror arrangement is superposed by an AC current which is contained in the output signal of the converter and has an amplitude changeable as a function of the digital signal.

3. A digital-to-analog converter as claimed in claim 2, wherein for a complete potential equalization of the output signal the value of the second current of the second current mirror arrangement is (2 m) times the value of the first current of the first current mirror arrangement.

4. A digital-to-analog converter as claimed in claim 2 wherein the first current mirror arrangement comprises a first transistor whose collector forms the input of the first current mirror arrangement, whose emitter is connected to a reference potential and whose collector and base are connected to each other, and includes n second transistors, each one of which is allocated to a respective one of the connection points (1+m) to (n+m), the collectors of which are connected to respective allocated connection points (Vn+m, Vn, Vn−1) and the emitters of which are connected to a reference potential, the bases of said second transistors being connected to the base of the first transistor.

5. A digital-to-analog converter as claimed in claim 2 where m=1.

6. A digital-to-analog converter as claimed in claim 2 wherein the second current mirror arrangement comprises a first transistor, whose collector forms the input of the second current mirror arrangement, whose emitter is connected to a reference potential, and a second transistor, whose base is supplied with the second current, whose collector is supplied with a supply voltage, whose emitter is connected to the base of the first transistor, and whose base is connected to the collector of the first transistor, wherein the second current mirror arrangement comprises n third transistors, each one of which is allocated to a respective one of the connection points 1 to n, and the collectors of which are connected to respective allocated connection points (Vn, Vn−1, V1), the emitters being connected to a reference potential, and the bases of said third transistors being connected to the base of the first transistor through a respective resistor,

7. A digital analog converter as claimed in claim 1, wherein for a complete potential equalization of the output signal the value of the second current of the second current mirror arrangement is (2 m) times the value of the first current of the first current mirror arrangement.

8. A digital analog converter as claimed in claim 7, wherein m=1.

9. A digital-to-analog converter as claimed in claim 7 wherein the first current mirror arrangement comprises a first transistor whose collector forms the input of the first current mirror arrangement, whose emitter is connected to a reference potential and whose collector and base are connected to each other, and includes n second transistors, each one of which is allocated to a respective one of the connection points (1+m) to (n+m), the collectors of which are connected to respective allocated connection points (Vn+m, Vn, Vn−1) and the emitters of which are connected to a reference potential, the bases of said second transistors being connected to the base of the first transistor.

10. A digital-to-analog converter as claimed in claim 9 wherein the second current mirror arrangement comprises a first transistor, whose collector forms the input of the second current mirror arrangement, whose emitter is connected to a reference potential, and a second transistor, whose base is supplied with the second current, whose collector is supplied with a supply voltage, whose emitter is connected to the base of the first transistor, and whose base is connected to the collector of the first transistor, wherein the second current mirror arrangement comprises n third transistors, each one of which is allocated to a respective one of the connection points 1 to n, and the collectors of which are connected to respective allocated connection points (Vn, Vn−1, V1), the emitters being connected to a reference potential, and the bases of said third transistors being connected to the base of the first transistor through a respective resistor.

11. A digital-to-analog converter as claimed in claim 1 wherein the first current mirror arrangement comprises a first transistor whose collector forms the input of the first current mirror arrangement, whose emitter is connected to a reference potential and whose collector and base are connected to each other, and includes n second transistors, each one of which is allocated a respective to one of the connection points (1+m) to (n+m), the collectors of which are connected to respective allocated connection points (Vn+m, Vn, Vn−1) and the emitters of which are connected to a reference potential, the bases of said second transistors being connected to the base of the first transistor.

12. A digital-to-analog converter as claimed in claim 11 wherein the second current mirror arrangement comprises a first transistor, whose collector forms the input of the second current mirror arrangement, whose emitter is connected to a reference potential, and a second transistor, whose base is supplied with the second current, whose collector is supplied with a supply voltage, whose emitter is connected to the base of the first transistor, and whose base is connected to the collector of the first transistor, wherein the second current mirror arrangement comprises n third transistors, each one of which is allocated to a respective one of the connection points 1 to n, and the collectors of which are connected to respective allocated connection points (Vn, Vn−1) and the V1), the emitters being connected to a reference potential, and the bases of said third transistors being connected to the base of the first transistor through a respective resistor.

13. A digital-to-analog converter as claimed in claim 12, wherein the bases of the third transistors of the second current mirror arrangement can be switched to a reference potential each via a respective allocated switch, which second current mirror arrangement is switched as a function of the state of each allocated bit of the digital signal, wherein the first and second currents of the first and second current mirror arrangements are chosen so that when a respective switch is open, the allocated second transistor of the first current mirror arrangement is cut off and the allocated third transistor of the second current mirror arrangement is rendered conductive, and wherein when the respective switch is closed, the allocated second transistor of the first current mirror arrangement is rendered conductive and the allocated third transistor of the second current mirror arrangement is cut off.

14. A digital-to-analog converter as claimed in claim 11, wherein the bases of the third transistors of the second current mirror arrangement can be switched to a reference potential each via a respective allocated switch, which second current mirror arrangement is switched as a function of the state of each allocated bit of the digital signal, wherein the first and second currents of the first and second current mirror arrangements are chosen so that when a respective switch is open, the allocated second transistor of the first current mirror arrangement is cut off and the allocated third transistor of the second current mirror arrangement is rendered conductive, and wherein when the respective switch is closed, the allocated second transistor of the first current mirror arrangement is rendered conductive and the allocated third transistor of the second current mirror arrangement is cut off.

15. A digital-to-analog converter as claimed in claim 1 wherein the second current mirror arrangement comprises a first transistor, whose collector forms the input of the second current mirror arrangement, whose emitter is connected to a reference potential, resistor, and a second transistor, whose base is supplied with the second current, whose collector is supplied with a supply voltage, whose emitter is connected to the base of the first transistor, and whose base is connected to the collector of the first transistor, wherein the second current mirror arrangement comprises n third transistors, each one of which is allocated to a respective one of the connection points 1 to n, and the collectors of which are connected to respective allocated connection points, (Vn, Vn−1, V1), the emitters being connected to a reference potential and the bases of said third transistors being connected to the base of the first transistor through a respective resistor.

16. A digital-to-analog converter as claimed in claim 15, wherein the bases of the third transistors of the second current mirror arrangement can be switched to a reference potential each via a respective allocated switch, which second current mirror arrangement is switched as a function of the state of each allocated bit of the digital signal, wherein the first and second currents of the first and second current mirror arrangements are chosen so that when a respective switch is open, the allocated second transistor of the first current mirror arrangement is cut off and the allocated third transistor of the second current mirror arrangement is rendered conductive, and wherein when the respective switch is closed, the allocated second transistor of the first current mirror arrangement is rendered conductive and the allocated third transistor of the second current mirror arrangement is cut off.

17. An audio and/or video playback device comprising a digital-to-analog converter as claimed in claim 1 arranged to influence the amplitude of an analog signal superposed on the first constant current, more specifically, of a volume signal, contrast signal or a colour saturation signal of a colour television set.

18. A digital-to-analog converter as claimed in claim 1 wherein $m=1$.

* * * * *